United States Patent
So

(10) Patent No.: US 7,633,731 B1
(45) Date of Patent: Dec. 15, 2009

(54) HIGH-VOLTAGE DUAL-POLARITY I/O P-WELL PUMP ESD PROTECTION CIRCUIT

(75) Inventor: Simon So, Mountain View, CA (US)

(73) Assignee: Actel Corporation, Mountain View, CA (US)

( * ) Notice: Subject to any disclaimer, the term of this patent is extended or adjusted under 35 U.S.C. 154(b) by 120 days.

(21) Appl. No.: 12/028,692

(22) Filed: Feb. 8, 2008

(51) Int. Cl.
*H02H 9/00* (2006.01)

(52) U.S. Cl. ...................................................... 361/56

(58) Field of Classification Search ............... 361/56
See application file for complete search history.

(56) References Cited

U.S. PATENT DOCUMENTS

| | | | |
|---|---|---|---|
| 5,751,507 A | * | 5/1998 | Watt et al. ..................... 361/56 |
| 6,690,066 B1 | * | 2/2004 | Lin et al. ..................... 257/355 |
| 6,933,567 B2 | | 8/2005 | Duvvury et al. |

OTHER PUBLICATIONS

Duvvury, Charvaka et al., "Substrate Pump NMOS for ESD Protection Applications", Electrical Overstress/Electrostatic Discharge Symposium Proceedings 2000,11 pages, IEEE, New York, New York, USA.

* cited by examiner

*Primary Examiner*—Stephen W Jackson
*Assistant Examiner*—Angela Brooks
(74) *Attorney, Agent, or Firm*—Lewis and Roca LLP

(57) ABSTRACT

An ESD protection circuit includes a discharge transistor formed in a p-well and having a drain coupled to the I/O pad, and a source coupled to ground. A MOS capacitor has a gate coupled to the I/O pad. A first resistor is coupled between the source and drain of the MOS capacitor and ground. A pull-down transistor has a drain coupled to the source and drain of the MOS capacitor, a source coupled to ground, and a gate coupled to a power-supply voltage node. A p-well control transistor has a source coupled to ground, and a drain coupled to the p-well. A second resistor is coupled between the I/O pad and the drain of the p-well control transistor. A pump transistor has a gate coupled to the gate of the discharge transistor, a drain coupled to the I/O pad, and a source coupled to the p-well.

12 Claims, 3 Drawing Sheets

HIGH-VOLTAGE DUAL-POLARITY I/O P-WELL PUMP ESD PROTECTION CIRCUIT

BACKGROUND

1. Field of the Invention

The present invention relates to integrated circuit technology. More particularly, the present invention relates to electrostatic discharge (ESD) protection for integrated circuits.

2. Prior Art

Recently, mixed signal analog and digital integrated circuits are becoming popular. The analog input/output (I/O) pads in such integrated circuits can accept input voltages over extended ranges greater than ±10V. Designing an on-chip electrostatic discharge (ESD) protection device for extended voltage range I/O can be challenging.

For on-chip electrostatic discharge (ESD) protection circuits, the first requirement for achieving a good protection structure is to provide a low-impedance discharge current path to shunt ESD current and clamp the I/O pad voltage to safe levels without causing damage to the internal circuit. As geometry scales in integrated circuits, the size of ESD devices does not scale proportionally. This scaling decreases gate oxide breakdown voltages which makes designing ESD protection devices more challenging.

The most common ESD circuit used in CMOS technology is a grounded-gate NMOS transistor, an example of which is shown in FIG. 1. The major failure mode in such an ESD circuit is caused by non-uniform current distribution.

To increase current handling capability, Texas Instruments has proposed a scheme where the substrate is biased. An example of such as scheme is shown in FIG. 2. The floating p+ guard ring is shown by the dashed line.

The drawback of such a design is that the I/O pad cannot handle negative voltages. To handle a negative voltage, the p-well must be controlled to avoid any forward bias condition.

BRIEF DESCRIPTION OF THE INVENTION

According to one aspect of the invention, an area efficient ESD protection circuit is provided for analog I/O which can support voltages for normal operation ranging from about ±10V. The present invention utilizes a pump to bias the p-well during an ESD event, resulting in uniform current distribution during an ESD event. In addition, the use of the p-well bias, allows reduction of the 10μ gate-to-drain-contact spacing to 1μ.

According to another aspect of the invention, an illustrative ESD protection circuit includes a discharge transistor formed in a p-well and having a drain coupled to the I/O pad, and a source coupled to ground. A MOS capacitor has a gate coupled to the I/O pad. A first resistor is coupled between the source and drain of the MOS capacitor and ground. A pulldown transistor has a drain coupled to the source and drain of the MOS capacitor, a source coupled to ground, and a gate coupled to a power-supply voltage node. A p-well control transistor has a source coupled to ground, and a drain coupled to the p-well. A second resistor is coupled between the I/O pad and the drain of the p-well control transistor. A pump transistor has a gate coupled to the gate of the discharge transistor, a drain coupled to the I/O pad, and a source coupled to the p-well.

BRIEF DESCRIPTION OF THE DRAWING FIGURES

DETAILED DESCRIPTION

The scheme of the present invention is universal and is portable from one technology to another. For example, the ESD protection scheme of the present invention provides an ESD solution for a high-voltage CMOS triple well process. Persons of ordinary skill in the art will realize that the following description of the present invention is illustrative only and not in any way limiting. Other embodiments of the invention will readily suggest themselves to such skilled persons.

Figure 1:
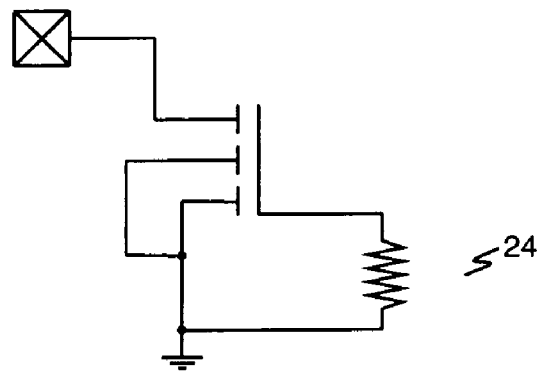
FIG. 1 is a schematic diagram of a commonly-used prior-art ESD protection circuit used in CMOS technology.
Figure 2:
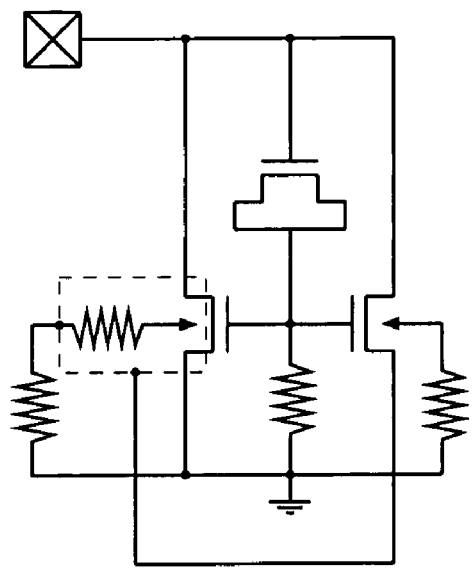
FIG. 2 is schematic diagram of a prior-art substrate pump NMOS protection device.
Figure 3:
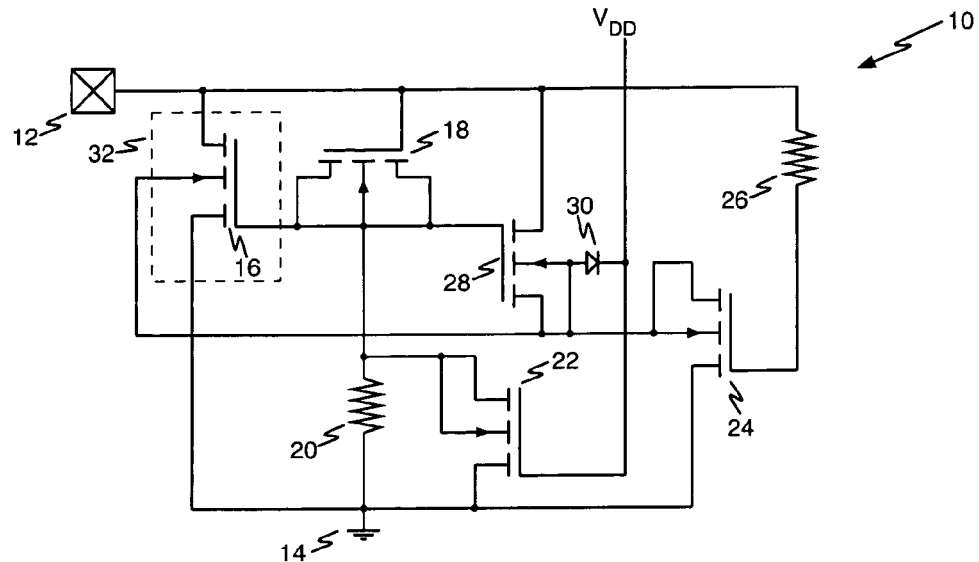
FIG. 3 is a schematic diagram of an illustrative high-voltage dual-polarity P-Well pump ESD circuit according to the present invention.

Referring now to FIG. 3, a schematic diagram depicting an illustrative ESD protection circuit 10 according to the present invention is shown. I/O pad 12 is coupled to ground (shown at reference numeral 14 through n-channel MOS discharge transistor 16, having one source/drain diffusion coupled to I/O pad 12 and the other source/drain diffusion coupled to ground 14. The gate of n-channel MOS discharge transistor 16 is coupled to I/O pad 12 through a MOS capacitor formed from n-channel MOS transistor 18, having its gate coupled to I/O pad 12 and both of its source/drain diffusions coupled to the gate of n-channel MOS discharge transistor 16. The source/drain diffusions of MOS capacitor 18 are coupled to ground through resistor 20.

N-channel MOS pulldown transistor 22 is connected across resistor 20, and has its source connected to ground, its drain connected to the common connection of the gate of discharge transistor 16 and resistor 20. The gate of n-channel MOS pulldown transistor 22 is connected to the power supply potential $V_{DD}$. N-channel MOS p-well control transistor 24 has its source connected to ground, its drain connected to its bulk connected and its gate connected to I/O pad 12 through resistor 26. N-channel MOS pump transistor 28 has its source connected to ground, its drain connected to I/O pad 12, and its bulk connected to the drain and bulk of n-channel MOS p-well control transistor 24 and the bulk of n-channel MOS discharge transistor 16. The gate of n-channel MOS pump transistor 28 is coupled to the gate of n-channel MOS discharge transistor 16. Diode 30 is a parasitic diode inherent in the MOS structure coupled between the bulk of n-channel MOS pump transistor 28 and $V_{DD}$.

According to the present invention, a p-well pump is used in the ESD protection circuit. The pump is designed to remain off during normal operation of the device and turn on only during an ESD event. During normal operation of the integrated circuit, the gate of n-channel MOS pulldown transistor 22 is biased at $V_{DD}$ and n-channel MOS pulldown transistor 22 is thus turned on, shorting resistor 20 and placing the gates of n-channel MOS transistors 16 and 28 at ground.

When the potential at I/O pad 12 is positive, n-channel MOS transistor 24 is turned on, since its gate is coupled to I/O pad 12 through resistor 26 and its source is grounded. Because the drain of n-channel MOS p-well control transistor 24 is coupled to the p-well (the bulks of transistors 16, 18, 24, and 28) the p-well is biased at essentially ground potential.

When the potential at I/O pad 12 is negative, n-channel MOS p-well control transistor 24 is turned off. The source/drain terminal connected to the I/O pad 12, acting as the source of transistor 28, is at a potential lower than the gate of n-channel MOS pump transistor 28, which is grounded through n-channel MOS pulldown transistor 22, thus turning on n-channel MOS pump transistor 28. The p-well potential thus tracks the potential at I/O pad 12 through n-channel MOS pump transistor 28.

During an ESD event, the $V_{DD}$ potential is not present because ESD events normally occur from human handling of the device, which does not occur when the device is receiving power, and n-channel MOS pulldown transistor 22 is thus turned off. MOS capacitor 18 is in series with resistor 20. A fraction of the pad voltage is coupled to the gate of the n-channel MOS pump transistor 28 by the MOS capacitor 18. When the voltage on the gate of the n-channel MOS pump transistor 28 is greater than the threshold voltage of the n-channel MOS pump transistor 28, it will turn on and start pumping current into the p-well. This action raises the bias in the p-well which promotes uniform current flow in the discharge of the NMOS device.

The RC time constant for the boost capacitor 18 and the resistor 20 is designed to be 10 ns for any ESD event, while the resistor 20 may have a value of, for example, 15 k Ohms. In normal operation, the gate of the n-channel MOS pump transistor 28 is pulled down by n-channel MOS pulldown transistor 22 which turns off the pump completely. This avoids unwanted triggering that could affect circuit performance. Resistor 26 is added in between the pad and the gate of the n-channel MOS p-well control transistor 24 to avoid turning it on during an ESD event. If the n-channel MOS p-well control transistor 24 is turned on, it will shunt the ESD and reduce ESD performance. The RC time constant for the network comprising the gate of p-well control transistor 24 and resistor 26 is between about 600 ns and about 800 ns (the discharge time of a human-body-model (HBM) pulse) to avoid turning on n-channel MOS p-well control transistor 24 during an ESD event. Persons of ordinary skill in the art will appreciate that the resistance value for resistor 26 will be easily derived from knowledge of the value of the gate capacitance of transistor 24 once the geometry of transistor 24 is known, given the desired RC time constant of between about 600 ns and about 800 ns.

Figure 4:
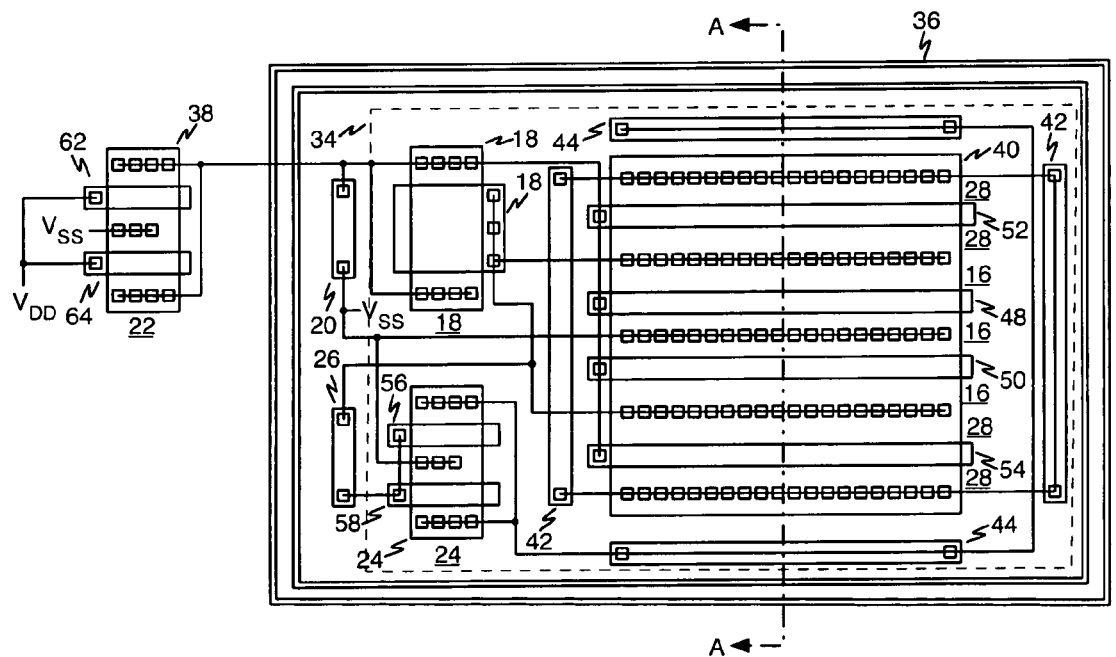
FIG. 4 is an illustrative layout for the high-voltage dual-polarity p-well pump ESD circuit of FIG. 3.
Figure 5:
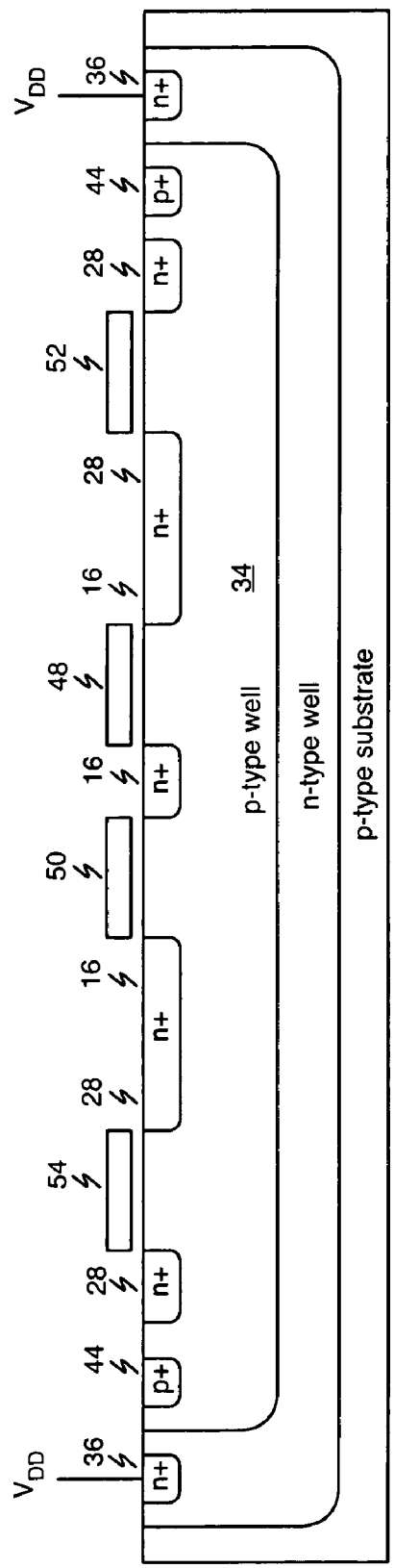
FIG. 5 is a cross-sectional view of the layout of FIG. 4, taken through the line A-A.

According to another aspect of the present invention, which will now be disclosed with reference to FIGS. 4 and 5, an illustrative layout of the circuit is shown, as well as a cross sectional view of the portion of the layout at line A-A. Referring now to FIGS. 4 and 5, it may be seen that transistors 16, 18, 24, and 28 are formed in the same p-well region 34 surrounded by a guard ring 36 formed in a n-well. Transistor 22 is shown formed in a p-type region 38 located outside of guard ring 36, but persons of ordinary skill in the art will appreciate that transistor 22 could also be formed within the guard ring.

N-channel MOS discharge transistor 16 and n-channel MOS pump transistor 28 share the same diffusion 40 in order to minimize the space used in silicon. N-channel MOS discharging transistor 16 is connected to a floating p-type guard ring disposed in p-well 40 that allows the current from an ESD event to be pumped into n-channel MOS discharging transistor 16 with a minimum voltage drop. This also allows uniform biasing in the p-well 34 to enhance current distribution. The floating p-type guard ring is divided into two sections. The sections identified by reference numerals 42 are connected to the n-channel MOS pump transistor 28 to provide minimum resistance for pump current to enter the p-well. The sections identified by reference numerals 44 are connected to transistor 24 to avoid the discharge of the ESD current from I/O pad 12. The locations of sections 38 are chosen to prevent latch-up problems during normal operation. Also, with proper biasing in the p-well 40 during an ESD event provided by the present invention, the spacing between the drain contact and the gate of both transistors 16 and 28 can be minimized; thus saving die area.

Using multifinger-structure transistors can aid in achieving uniform current distribution and greatly increase current handling capability and in turn increase ESD protection performance. Thus it may be seen from an examination of FIG. 4 that transistors 16, 22, 24, and 28 are formed as multifinger structures having their sources in the center and twin drains located outside of two gate regions. Transistor 16 has its source located in the center of diffused region 40 and has twin drain regions separated from the central source region by gates 48 and 50. Transistor 28 is formed in two sections, the sources of each located outside of gates 48 and 50, separated from twin drains on the outside of diffused region 40 by gate regions 52 and 54.

Transistor 24 has twin gate regions 56 and 58 that separate a central source region from two outer drain regions. Resistors 20 and 26 are shown formed from separate polysilicon regions disposed in FIG. 4 to the left of transistors 18 and 24. MOS capacitor transistor 24 is shown located to the right of resistor 20 in FIG. 4, its gate indicated at reference numeral 60. N-channel MOS pulldown transistor 22 is shown formed in two sections similarly to transistor 24, with a central source region separated from two outer drain regions by gate regions 62 and 64.

To allow dual polarity high-voltage application, the process must allow high-voltage devices in triple wells. When the pad voltage is biased positively, the P-Well control transistor is turned on, allowing the voltage of the p-well to track ground potential. Conversely when the pad voltage is negative, the p-well control transistor 24 is turned off, the pump transistor 28 is on and the voltage of the p-well is tracked to the I/O pad to avoid forward biasing of the parasitic diode 30. As a result, the voltage at I/O pad 12 can be allowed to swing in both positive and negative directions.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A high-voltage dual-polarity p-well pump ESD protection circuit for an I/O pad of an integrated circuit comprising:
   an n-channel MOS discharge transistor formed in a p-well and having a drain coupled to the I/O pad, a source coupled to ground, and a gate;
   a MOS capacitor having a gate coupled to the I/O pad, a source and a drain;
   a first resistor coupled between the source and drain of the MOS capacitor and a ground node;
   an n-channel MOS pulldown transistor having a drain coupled to the source and drain of the MOS capacitor, a source coupled to the ground node, and a gate coupled to a power-supply voltage node;
   an n-channel MOS p-well control transistor having a source coupled to the ground node, a drain coupled to the p-well, and a gate;

a second resistor coupled between the I/O pad and the drain of the n-channel MOS p-well control transistor;

an n-channel MOS pump transistor having a gate coupled to the gate of the first n-channel MOS transistor, a drain coupled to the I/O pad, and a source coupled to the p-well.

2. The high-voltage dual-polarity p-well pump ESD protection circuit of claim 1 wherein the first resistor and the MOS capacitor have a time constant of about 10 ns.

3. The high-voltage dual-polarity p-well pump ESD protection circuit of claim 2 wherein the first resistor has a resistance of about 15K ohms.

4. The high-voltage dual-polarity p-well pump ESD protection circuit of claim 1 wherein the n-channel MOS p-well control transistor has a time constant between about 600 ns and about 800 ns.

5. The high-voltage dual-polarity p-well pump ESD protection circuit of claim 4 wherein the second resistor has a resistance of about 15K ohms.

6. The high-voltage dual-polarity p-well pump ESD protection circuit of claim 1 where the n-channel MOS discharge transistor is formed in a p-well surrounded by a guard ring.

7. The high-voltage dual-polarity p-well pump ESD protection circuit of claim 1 wherein the n-channel MOS discharge transistor, the MOS p-well control transistor, and the n-channel MOS pump transistor are formed in a common p-well surrounded by a guard ring.

8. The high-voltage dual-polarity p-well pump ESD protection circuit of claim 7 wherein the n-channel MOS pull-down transistor is formed in the common p-well.

9. The high-voltage dual-polarity p-well pump ESD protection circuit of claim 7 wherein the n-channel MOS pull-down transistor is formed in a p-well separate from the common p-well.

10. The high-voltage dual-polarity p-well pump ESD protection circuit of claim 1 wherein the n-channel MOS discharge transistor is a multifinger structure.

11. The high-voltage dual-polarity p-well pump ESD protection circuit of claim 1 wherein the n-channel MOS discharge transistor and the n-channel MOS pump transistor are multifinger structures.

12. The high-voltage dual-polarity p-well pump ESD protection circuit of claim 11 wherein the n-channel MOS pull-down transistor and the n-channel MOS p-well control transistors are multifinger structures.

* * * * *